US012740144B2

(12) United States Patent
Shin et al.

(10) Patent No.: US 12,740,144 B2
(45) Date of Patent: Sep. 15, 2026

(54) DISPLAY APPARATUS

(71) Applicant: Samsung Display Co., Ltd., Yongin-si (KR)

(72) Inventors: Donghee Shin, Yongin-si (KR); Sunkwun Son, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 664 days.

(21) Appl. No.: 18/312,661

(22) Filed: May 5, 2023

(65) Prior Publication Data

US 2024/0030243 A1 Jan. 25, 2024

(30) Foreign Application Priority Data

Jul. 22, 2022 (KR) ........................ 10-2022-0091315

(51) Int. Cl.
*H10D 86/40* (2025.01)

(52) U.S. Cl.
CPC ......... *H10D 86/481* (2025.01); *H10D 86/441* (2025.01); *H10D 86/451* (2025.01)

(58) Field of Classification Search
CPC .. H10D 86/481; H10D 86/441; H10D 86/451; H10D 86/471; H10K 59/1216
See application file for complete search history.

(56) References Cited

U.S. PATENT DOCUMENTS

2017/0179164 A1 6/2017 Choi et al.
2017/0294464 A1 10/2017 Kwon
2018/0151114 A1* 5/2018 Choi .................... H10D 86/481
2018/0366532 A1 12/2018 Park et al.
2021/0202659 A1 7/2021 Lee et al.

FOREIGN PATENT DOCUMENTS

| | | |
|---|---|---|
| KR | 10-2016-0057015 | 5/2016 |
| KR | 10-2017-0074267 | 6/2017 |
| KR | 10-2018-0036818 | 4/2018 |
| KR | 10-2017-0115641 | 10/2018 |
| KR | 10-2021-0086441 | 7/2021 |

* cited by examiner

*Primary Examiner* — Peter M Albrecht

(74) *Attorney, Agent, or Firm* — Womble Bond Dickinson (US) LLP

(57) ABSTRACT

A display apparatus includes a first transistor including a first semiconductor layer, a first gate electrode overlapping a first channel area of the first semiconductor layer, a second transistor including a second semiconductor layer, a second gate electrode overlapping a second channel area of the second semiconductor layer, a storage capacitor electrically connected to the first and second transistors and comprising a first and second electrodes overlapping each other, wherein the second electrode of the storage capacitor includes a lower electrode below the first electrode and an upper electrode above the first electrode, the lower electrode and the upper electrode being electrically connected to each other, the second semiconductor layer includes a first area and a second area spaced apart from each other with the second channel area therebetween, and the first electrode of the storage capacitor is disposed in the second area of the second semiconductor layer.

19 Claims, 13 Drawing Sheets

DISPLAY APPARATUS

CROSS-REFERENCE TO RELATED APPLICATIONS

This application is claims priority to and benefits of Korean Patent Application No. 10-2022-0091315 under 35 U.S.C. § 119, filed on Jul. 22, 2022, in the Korean Intellectual Property Office (KIPO), the disclosure of which is incorporated by reference herein in its entirety.

BACKGROUND

1. Technical Field

One or more embodiments relate to a display apparatus.

2. Description of the Related Art

A display apparatus visually displays data. As display apparatuses are becoming thinner and lighter, the range of use of the display apparatuses has further increased.

Various types of display apparatuses have been studied to provide images having high quality.

SUMMARY

One or more embodiments include a structure of a display apparatus.

Additional aspects will be set forth in part in the description which follows and, in part, will be apparent from the description, or may be learned by practice of the presented embodiments of the disclosure.

According to one or more embodiments, a display apparatus includes a first transistor including a first semiconductor layer on a substrate and a first gate electrode overlapping a first channel area of the first semiconductor layer in a plan view, a second transistor including a second semiconductor layer on the substrate, and a second gate electrode overlapping a second channel area of the second semiconductor layer in a plan view, a storage capacitor electrically connected to the first transistor and the second transistor and comprising a first electrode and a second electrode, the first electrode and the second electrode overlapping each other in a plan view, wherein the second electrode of the storage capacitor includes a lower electrode below the first electrode and an upper electrode above the first electrode, the lower electrode and the upper electrode being electrically connected to each other, the second semiconductor layer includes a first area and a second area spaced apart from each other with the second channel area between the first and second areas, and the first electrode of the storage capacitor is disposed in the second area of the second semiconductor layer.

The display apparatus may further include a first insulating layer between the lower electrode and the first electrode, and a second insulating layer on the second semiconductor layer and the first electrode, wherein a side surface of the second semiconductor layer and a side surface of the first electrode may directly contact a third insulating layer instead of the second insulating layer.

The second insulating layer may include a first portion overlapping the first area and the second area of the second semiconductor layer and having a first thickness in a plan view, and a second portion overlapping the second channel area of the second semiconductor layer in a plan view and having a second thickness that is greater than the first thickness.

A first portion of the upper electrode may overlap the first electrode and the second insulating layer in a plan view, and a second portion of the upper electrode may extend on the lower electrode by passing by the side surface of the first electrode and a side surface of the second insulating layer.

The second portion of the upper electrode may be electrically connected to the lower electrode through a first contact hole penetrating a portion of the first insulating layer and a portion of the third insulating layer, the first insulating layer and the third insulating layer being between the upper electrode and the lower electrode.

The first gate electrode of the first transistor may have an isolated shape in a plan view and may be electrically connected to the first electrode.

The display apparatus may further include an insulating layer having a portion between the first channel area of the first semiconductor layer and the first gate electrode, wherein a thickness of the portion of the insulating layer may be greater than a thickness of another portion of the insulating layer, the another portion being positioned on an impurity-doped area of the first semiconductor layer.

A first portion of the first gate electrode may overlap the first channel area of the first semiconductor layer in a plan view, and a second portion of the first gate electrode may extend on the first electrode and may be connected to the first electrode through a second contact hole penetrating at least one insulating layer between the first electrode and the second portion.

A portion of the lower electrode may overlap the first channel area of the first semiconductor layer and the first gate electrode in a plan view.

The display apparatus may further include barrier metal layers respectively between the first channel area of the first semiconductor layer and the first gate electrode and between the second channel area of the second semiconductor layer and the second gate electrode.

Each of the barrier metal layers may include titanium.

According to one or more embodiments, a display apparatus includes a first transistor including a first semiconductor layer disposed on a substrate, and a first gate electrode overlapping a first channel area of the first semiconductor layer in a plan view, a second transistor including a second semiconductor layer disposed on the substrate, and a second gate electrode overlapping a second channel area of the second semiconductor layer in a plan view, a storage capacitor electrically connected to the first transistor and the second transistor, wherein the second semiconductor layer includes a first area and a second area which are spaced apart from each other with the second channel area between the first and second areas, the storage capacitor includes a first electrode electrically connected to the first gate electrode and the second semiconductor layer, a lower electrode between the substrate and the first electrode, a first insulating layer between the lower electrode and the first electrode, an upper electrode disposed on the first electrode and electrically connected to the lower electrode, a second insulating layer between the first electrode and the upper electrode, and a third insulating layer covering a side surface of the first electrode and a side surface of the second semiconductor layer and having a portion between the lower electrode and the upper electrode, the first electrode of the storage capacitor is integral with the second semiconductor layer, and a thickness of a first portion of the second insulating layer is greater than a thickness of a second portion of the second insulating layer, the first portion overlapping the first electrode in a plan view, and the second portion overlapping the second channel area of the second semiconductor layer in a plan view.

The third insulating layer may directly contact a side surface of the second semiconductor layer and the side surface of the first electrode.

A first portion of the upper electrode may overlap the first electrode and the second insulating layer in a plan view, and a second portion of the upper electrode may extend on the lower electrode by passing by the side surface of the first electrode and a side surface of the second insulating layer.

The second portion of the upper electrode may be electrically connected to the lower electrode through a first contact hole penetrating a portion of the first insulating layer and a portion of the third insulating layer, the first insulating layer and the third insulating layer being between the upper electrode and the lower electrode.

The display apparatus may further include barrier metal layers respectively between the first channel area of the first semiconductor layer and the first gate electrode and between the second channel area of the second semiconductor layer and the second gate electrode.

Each of the barrier metal layers may include titanium.

The first gate electrode of the first transistor may have an isolated shape in a plan view and may be electrically connected to the first electrode.

A first portion of the first gate electrode may overlap the first channel area in a plan view, and a second portion of the first gate electrode may be disposed on the third insulating layer covering a side surface of the first channel area and a side surface of the first electrode and may be connected to the first electrode through a second contact hole penetrating the third insulating layer and the second insulating layer.

A portion of the lower electrode may overlap the first channel area of the first semiconductor layer and the first gate electrode in a plan view.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
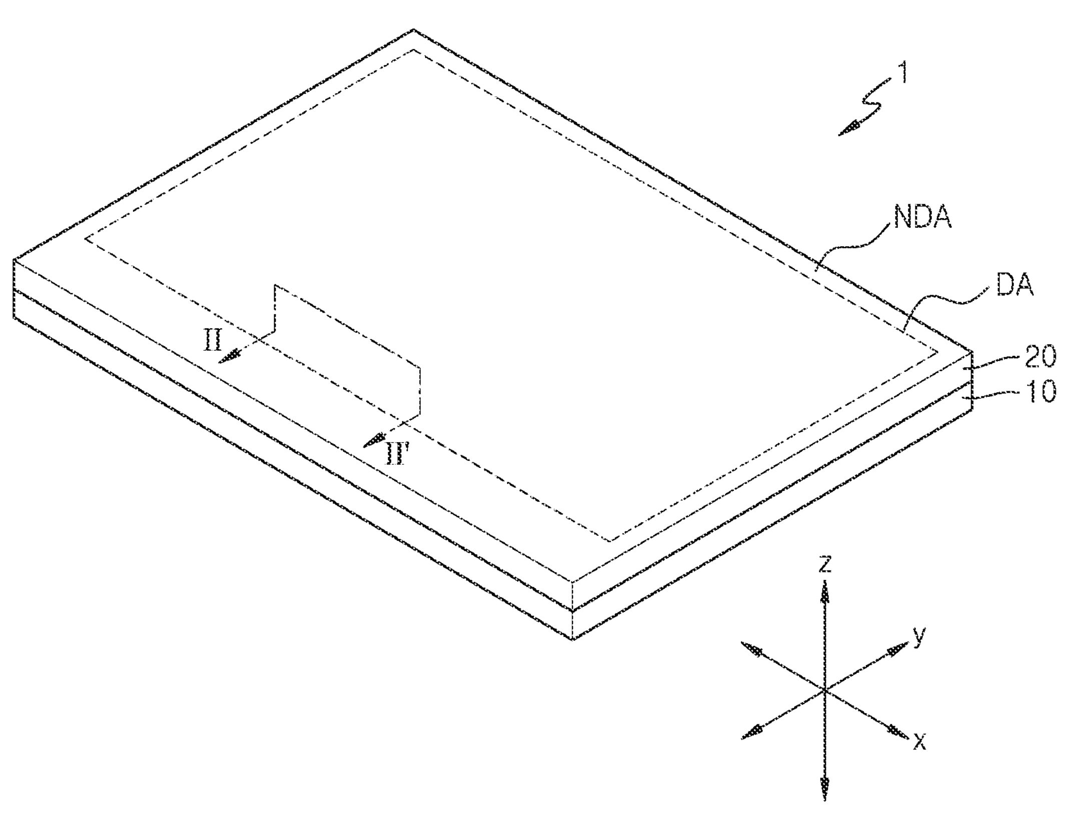
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

In the following embodiments, while such terms as “first,” “second,” or the like may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as “including,” “comprising,” and “having” are intended to indicate the existence of the features, or elements disclosed in the disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Spatially relative terms, such as “beneath,” “below,” “under,” “lower,” “on,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view of a display apparatus 1 according to an embodiment.

Referring to FIG. 1, the display apparatus 1 may include a display area DA and a non-display area NDA outside the display area DA. The display apparatus 1 may provide an image through an array of sub-pixels, which are two-dimensionally arranged in the display area DA.

Each of the sub-pixels of the display apparatus 1 is an area capable of emitting a certain color of light, and the display apparatus 1 may provide an image by using light emitted from the sub-pixels. For example, each of the sub-pixels may emit red, green, or blue light.

The non-display area NDA is an area which does not provide an image, and may entirely surround the display area DA. A driver or a main power line, which provides an electrical signal or power to sub-pixel circuits, may be arranged in the non-display area NDA. A pad, to which an electronic device or a printed circuit board may be electrically connected, may be arranged in the non-display area NDA.

The display area DA may have a polygonal shape including a quadrangular shape, as shown in FIG. 1. For example, the display area DA may have a rectangular shape in which a horizontal length is greater than a vertical length, a rectangular shape in which a horizontal length is less than a vertical length, or a square shape. As another example, the display area DA may have various shapes, such as an oval shape or a circular shape.

Figure 2:
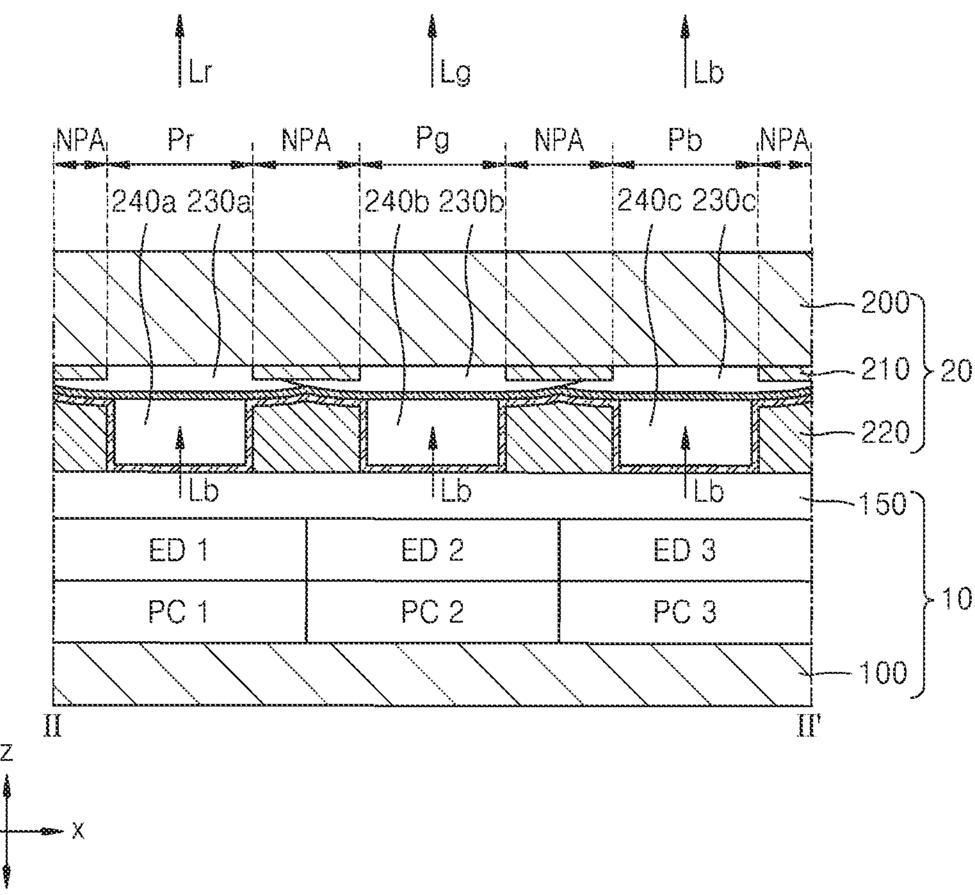
FIG. 2 is a schematic cross-sectional view of the display apparatus taken along line II-II' of FIG. 1, according to an embodiment.

FIG. 2 is a schematic cross-sectional view of the display apparatus taken along line II-II' of FIG. 1, according to an embodiment.

In some embodiments, the display apparatus may include an emission structure 10 and a color structure 20, which are stacked each other in a thickness direction (e.g., a z direction) of the display apparatus. Referring to FIG. 2, the emission structure 10 may include first to third sub-pixel circuits PC1, PC2, and PC3 on a first substrate 100, and first to third light-emitting diodes ED1, ED2, and ED3 respectively electrically connected to the first to third sub-pixel circuits PC1, PC2, and PC3.

Light (e.g., blue light Lb) emitted from the first to third light-emitting diodes ED1, ED2, and ED3 may be converted into green light Lg, red light Lr, and blue light Lb while passing through the color structure 20, or may pass through the color structure 20 without being converted. An area where the green light Lg is emitted may correspond to a green sub-pixel Pg, an area where the red light Lr is emitted may correspond to a red sub-pixel Pr, and an area where the blue light Lb is emitted may correspond to a blue sub-pixel Pb.

The first to third light-emitting diodes ED1, ED2, and ED3 may be sealed by an encapsulation layer 150. The encapsulation layer 150 may include at least one inorganic encapsulation layer and at least one organic encapsulation layer. In an embodiment, the encapsulation layer 150 may include a structure of a first inorganic encapsulation layer, an organic encapsulation layer on the first inorganic encapsulation layer, and a second inorganic encapsulation layer on the organic encapsulation layer.

The color structure 20 may include a second substrate 200 and a first light-blocking layer 210 on (or under) the second substrate 200. The first light-blocking layer 210 may include holes formed by removing portions respectively corresponding to the green sub-pixel Pg, the red sub-pixel Pr, and the blue sub-pixel Pb. The first light-blocking layer 210 may include a material portion in a non-pixel area NPA, and the material portion may include various materials capable of absorbing light.

A second light-blocking layer 220 may be disposed on (or under) the first light-blocking layer 210. The second light-blocking layer 220 may also include a material portion in the non-pixel area NPA. The second light-blocking layer 220 may include various materials capable of absorbing light. The second light-blocking layer 220 and the first light-blocking layer 210 may include the same material as each other, or may include different materials from each other.

The first light-blocking layer 210 and/or the second light-blocking layer 220 may include an opaque inorganic insulating material, such as chromium oxide, molybdenum oxide, a combination thereof, or the like, or may include an opaque organic insulating material, such as a black resin or the like.

A color layer including first to third color filters **230*a*, 230*b*, and 230*c* may be disposed on a lower surface of the second substrate 200. The first color filter 230*a* may include a pigment or dye of a first color (e.g., red). The second color filter 230*b* may include a pigment or dye of a second color (e.g., green). The third color filter 230*c*** may include a pigment or dye of a third color (e.g., blue).

A color-conversion-transmissive layer including a first color conversion part 240_a_, a second color conversion part 240_b_, and a transmission part 240_c_ may be disposed below the first to third color filters 230_a_, 230_b_, and 230_c_.

The first color conversion part 240_a_ may overlap the first color filter 230_a_, and may convert the incident blue light Lb into red light Lr. The first color conversion part 240_a_ may include a first photosensitive polymer in which first quantum dots and first scattering particles are dispersed.

The first quantum dots may be excited by the blue light Lb to isotropically emit red light Lr having a greater wavelength than that of the blue light Lb. The first photosensitive polymer may be an organic material having light transmittance. The first scattering particles may scatter the blue light Lb that is not absorbed by the first quantum dots to allow the first quantum dots to be excited, thereby increasing color conversion efficiency. The first scattering particles may be, for example, titanium oxide ($TiO_2$), metal particles, a combination thereof, or the like. The first quantum dots may be selected from a Group II-VI compound, a Group III-V compound, a Group IV-VI compound, a Group IV element, a Group IV compound, and a combination thereof.

The second color conversion part 240_b_ may overlap the second color filter 230_b_, and may convert the incident blue light Lb into green light Lg. The second color conversion part 240_b_ may include a second photosensitive polymer in which second quantum dots and second scattering particles are dispersed.

The second quantum dots may be excited by the blue light Lb to isotropically emit green light Lg having a greater wavelength than that of the blue light Lb. The second photosensitive polymer may be an organic material having light transmittance. The second scattering particles may scatter the blue light Lb that is not absorbed by the second quantum dots to allow the second quantum dots to be excited, thereby increasing color conversion efficiency. The second scattering particles may be, for example, titanium oxide ($TiO_2$), metal particles, a combination thereof, or the like. The second quantum dots may be selected from a Group II-VI compound, a Group III-V compound, a Group IV-VI compound, a Group IV element, a Group IV compound, and a combination thereof. The second quantum dot may include the same material as that of the first quantum dot, and the size of the second quantum dot may be greater than the size of the first quantum dot.

The transmission part 240_c_ may allow the blue light Lb to pass therethrough. The transmission part 240_c_ may include a third photosensitive polymer in which third scattering particles are dispersed. The third photosensitive polymer may be, for example, an organic material having light transmittance, such as a silicon resin, an epoxy resin, a combination thereof, or the like, and the third photosensitive polymer and the first and second photosensitive polymers may include a same material. The third scattering particles may scatter and emit the blue light Lb, and the third scattering particles and the first and second scattering particles may have a same material.

After the blue light Lb emitted from the emission structure 10 is converted or transmitted while passing through a color-conversion-transmissive layer, the color purity of image of the display apparatus may be improved while passing through a color layer.

The blue light Lb emitted from the first light-emitting diode ED1 of the emission structure 10 may pass through a first color area of the color structure 20. The blue light Lb may be converted and filtered into red light Lr while passing through the color structure 20. The first color area may include a stacked structure of the first color conversion part 240_a_ and the first color filter 230_a_.

The blue light Lb emitted from the second light-emitting diode ED2 of the emission structure 10 may pass through a second color area of the color structure 20. The blue light Lb may be converted and filtered into green light Lg while passing through the color structure 20. The second color area may include a stacked structure of the second color conversion part 240_b_ and the second color filter 230_b_.

The blue light Lb emitted from the third light-emitting diode ED3 of the emission structure 10 may pass through a third color area of the color structure 20. The blue light Lb may pass through the color structure 20. The third color area may include a stacked structure of the transmission part 240_c_ and the third color filter 230_c_.

The display apparatus 1 having the above structure is an apparatus that displays a video or a still image, and may be used as a display screen of various products, such as a television, a laptop computer, a monitor, a billboard, and Internet of Things (IoT) device. As another example, the display apparatus 1 may be a portable electronic device, such as a mobile phone, a smartphone, a tablet personal computer (PC), a mobile communication terminal, an electronic notebook, an electronic-book reader, a portable multimedia player (PMP), a navigation device, an Ultra Mobile PC (UMPC), or the like. The display apparatus 1 according to an embodiment may be used as a wearable device, such as a smartwatch, a watch phone, a glasses-type display, and a head-mounted display (HMD). The display apparatus 1 according to an embodiment may be used as a dashboard of a vehicle, a center fascia of a vehicle or a center information display (CID) arranged on a dashboard, a rear-view mirror display replacing a side-view mirror of a vehicle, and a display arranged on a back surface of a front seat as an entertainment device for a back seat of a vehicle.

Figure 3:
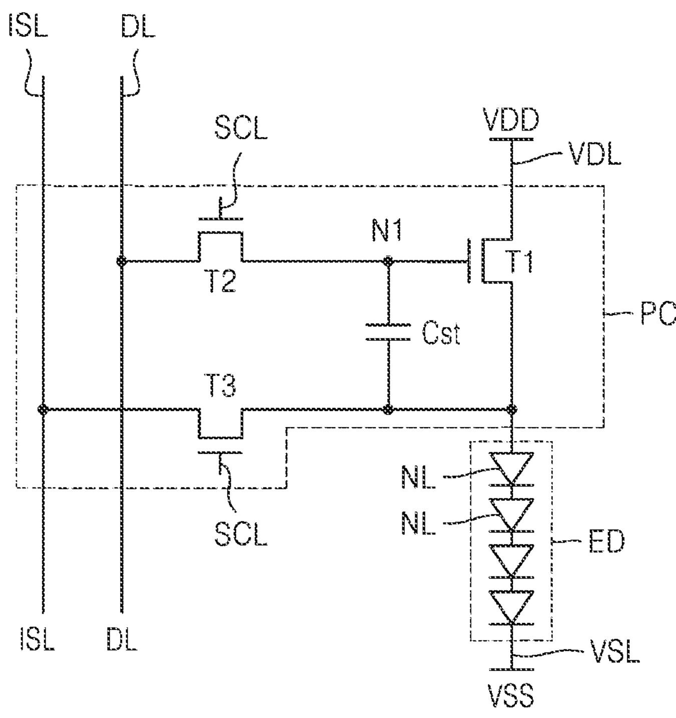
FIG. 3 is a schematic diagram of an equivalent circuit illustrating a sub-pixel circuit of a display apparatus according to an embodiment and a light-emitting diode electrically connected to the sub-pixel circuit.

FIG. 3 is a schematic diagram of an equivalent circuit illustrating a sub-pixel circuit PC of a display apparatus according to an embodiment and a light-emitting diode ED electrically connected to the sub-pixel circuit PC.

Referring to FIG. 3, the sub-pixel circuit PC may be electrically connected to the light-emitting diode ED. The sub-pixel circuit PC of FIG. 3 may correspond to each of the first to third sub-pixel circuits PC1, PC2, and PC3 described with reference to FIG. 2, and the light-emitting diode ED of FIG. 3 may correspond to each of the first to third light-emitting diodes ED1, ED2, and ED3 described with reference to FIG. 2. In other words, each of the first to third sub-pixel circuits PC1, PC2, and PC3 described with reference to FIG. 2 and the sub-pixel circuit PC shown in FIG. 3 may include a same structure, and each of the first to third light-emitting diodes ED1, ED2, and ED3 described with reference to FIG. 2 and the light-emitting diode ED shown in FIG. 3 may include a same structure.

The sub-pixel circuit PC may include three transistors and a capacitor. For example, the sub-pixel circuit PC may include a first transistor T1, a second transistor T2, a third transistor T3, and a storage capacitor Cst.

The first transistor T1 may be electrically connected to a first voltage line VDL supplying first power VDD thereto and the light-emitting diode ED. For example, a first electrode (e.g., a source electrode) of the first transistor T1 may be electrically connected to the first voltage line VDL, and a second electrode (e.g., a drain electrode) of the first transistor T1 may be electrically connected to the light-emitting diode ED. A gate electrode of the first transistor T1 may be electrically connected to a first node N1. The first transistor T1 may control a driving current supplied to the light-emitting diode ED in response to a voltage of the first node N1. The first transistor T1 may correspond to a driving transistor.

The second transistor T2 may be electrically connected to a data line DL and the first node Ni. For example, a first electrode (e.g., a source electrode) of the second transistor T2 may be electrically connected to the data line DL, and a second electrode (e.g., a drain electrode) of the second transistor T2 may be electrically connected to the first node N1. A gate electrode of the second transistor T2 may be electrically connected to a scan line SCL. The second transistor T2 may be turned on in case that a scan signal of a gate-on voltage (e.g., a low-level voltage) is supplied from the scan line SCL to electrically connect the data line DL and the first node N1 to each other. The second transistor T2 may be a switching transistor for providing a data line signal to the first transistor T1.

A first electrode of the storage capacitor Cst may be electrically connected to the first node N1, and a second electrode of the storage capacitor Cst may be electrically connected to the first voltage line VDL. The storage capacitor Cst may be charged with a voltage corresponding to a data signal supplied to the first node N1 during each frame.

The third transistor T3 may be electrically connected to the first transistor T1 and an initialization sensing line ISL. For example, an electrode of the third transistor T3 may be electrically connected to an electrode (e.g., a source electrode) of the first transistor T1, and another electrode of the third transistor T3 may be electrically connected to the initialization sensing line ISL. The initialization sensing line ISL may function as an initialization voltage line performing an initialization operation.

A gate electrode of the third transistor T3 may be electrically connected to the scan line SCL. The scan line SCL may function as a sensing control line. FIG. 3 illustrates that each of the gate electrode of the second transistor T2 and the gate electrode of the third transistor T3 is electrically connected to the scan line SCL, but in another embodiment, the gate electrode of the third transistor T3 may be electrically connected to a sensing control line separated from the scan line SCL. The third transistor T3 may be turned on by a sensing control signal of a gate-on voltage (e.g., a high-level voltage) supplied to the scan line SCL for a certain sensing period to electrically connect the initialization sensing line ISL and the first transistor T1 to each other.

The light-emitting diode ED may include light-emitting elements NL, which are electrically connected to each other. The light-emitting elements NL may be electrically connected in series, in parallel, or in series and parallel. The light-emitting elements NL may each be a light-emitting element having a pillar shape. The pillar shape may include a rod-like shape or a bar-like shape in a longitudinal direction (for example, an aspect ratio greater than about 1), such as a cylindrical shape or a polyprismatic shape. For example, the length of the light-emitting element NL may be greater than the diameter (or the width of a cross-section) of the light-emitting element NL. The light-emitting element NL may include a first semiconductor layer, a second semiconductor layer, and an active layer between the first and second semiconductor layers. One of the first semiconductor layer and the second semiconductor layer may be electrically connected to a first electrode of the light-emitting diode ED, the first electrode being electrically connected to the sub-pixel circuit PC, and the other one of the first semiconductor layer and the second semiconductor layer may be electrically connected to a second electrode of the light-emitting diode ED, the second electrode being electrically connected to a second voltage line VSL providing a second voltage VSS.

The first semiconductor layer may be a semiconductor layer of a first conductivity type. For example, the first semiconductor layer may include a p-type semiconductor layer. For example, the first semiconductor layer may include at least one semiconductor material selected from InAlGaN, GaN, AlGaN, InGaN, AlN, and InN, and may include a p-type semiconductor layer doped with a dopant of a first conductivity type, such as Mg or the like.

The active layer may be disposed on the first semiconductor layer, and may be formed in a single-quantum well or multi-quantum well structure. The position of the active layer may be variously changed depending on the type of the light-emitting element NL. A clad layer (not shown) doped with a conductive dopant may be formed on an upper portion and/or lower portion of the active layer. For example, the clad layer may be formed of AlGaN or InAlGaN. In an embodiment, a material, such as AlGaN, InAlGaN, a combination thereof, or the like, may be used to form the active layer.

The second semiconductor layer may include a semiconductor layer of a different type from that of the first semiconductor layer. For example, the second semiconductor layer may include an n-type semiconductor layer. For example, the second semiconductor layer may include at least one semiconductor material selected from InAlGaN, GaN, AlGaN, InGaN, AlN, and InN, and may include an n-type semiconductor layer doped with a dopant of a second conductivity type, such as Si, Ge, Sn, a combination thereof, or the like.

The light-emitting element NL may have a small size to a degree of a nanometer scale to a micrometer scale. For example, each of the light-emitting elements NL may have a diameter (or width) and/or a length ranging from a nanometer scale to a micrometer scale.

In another embodiment, the light-emitting diode ED may include an anode electrode, a cathode electrode, and an emission layer between the anode electrode and the cathode electrode. The emission layer may include an organic material, an inorganic material, and/or quantum dots. The emission layer may have a single stacked structure including a single emission layer, or a tandem structure. The tandem structure may include stacks each including an emission layer. The tandem structure may include a charge generation layer (CGL) between adjacent two stacks.

FIG. 3 illustrates a case in which the first to third transistors T1, T2, and T3 are n-type transistors, but the disclosure is not limited thereto. For example, at least one selected from among the first to third transistors T1, T2, and T3 may be a p-type transistor.

Figure 4:
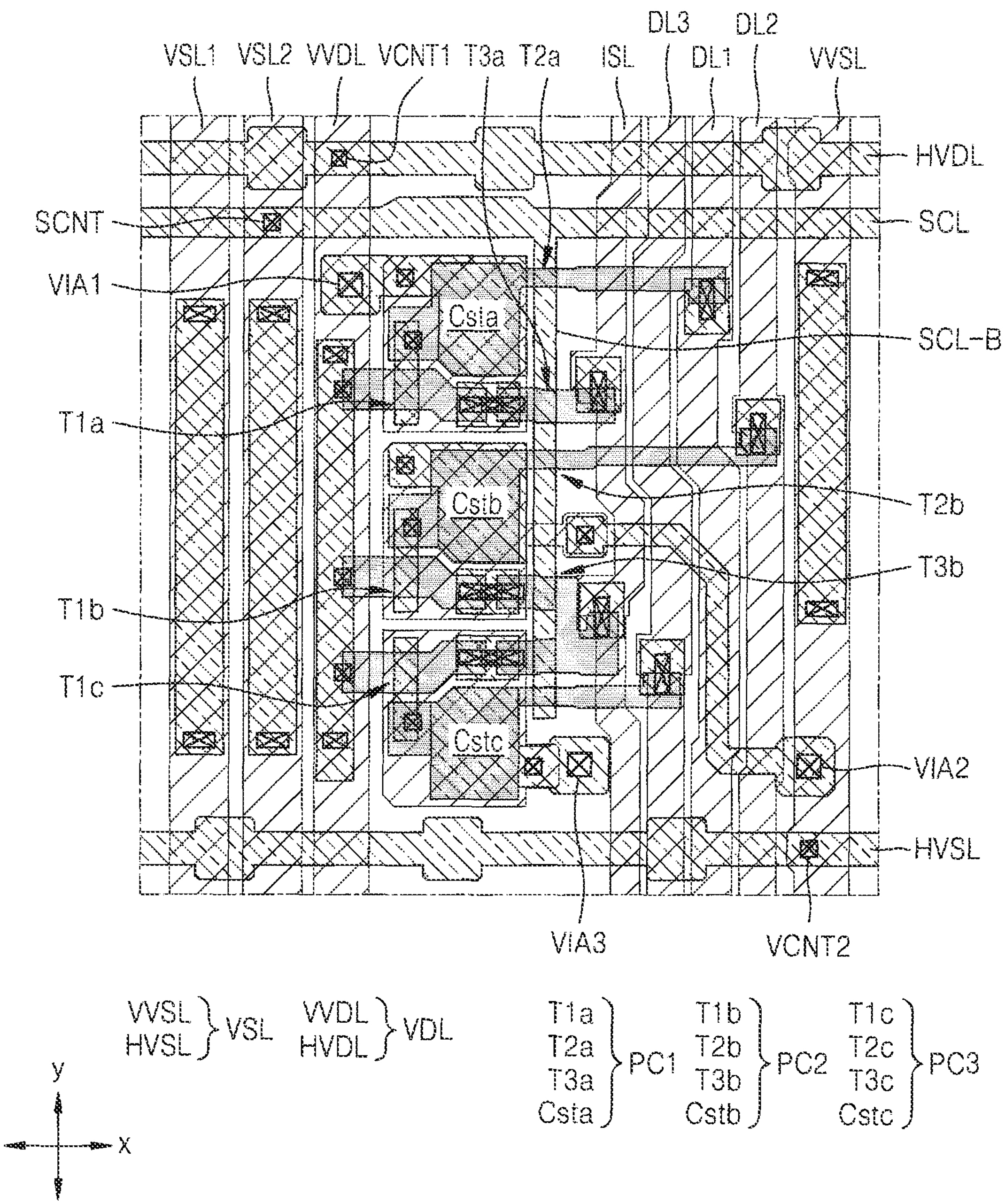
FIG. 4 is a schematic plan view illustrating sub-pixel circuits of a display apparatus according to an embodiment and signal lines and voltage lines electrically connected to the sub-pixel circuits.
Figure 5:
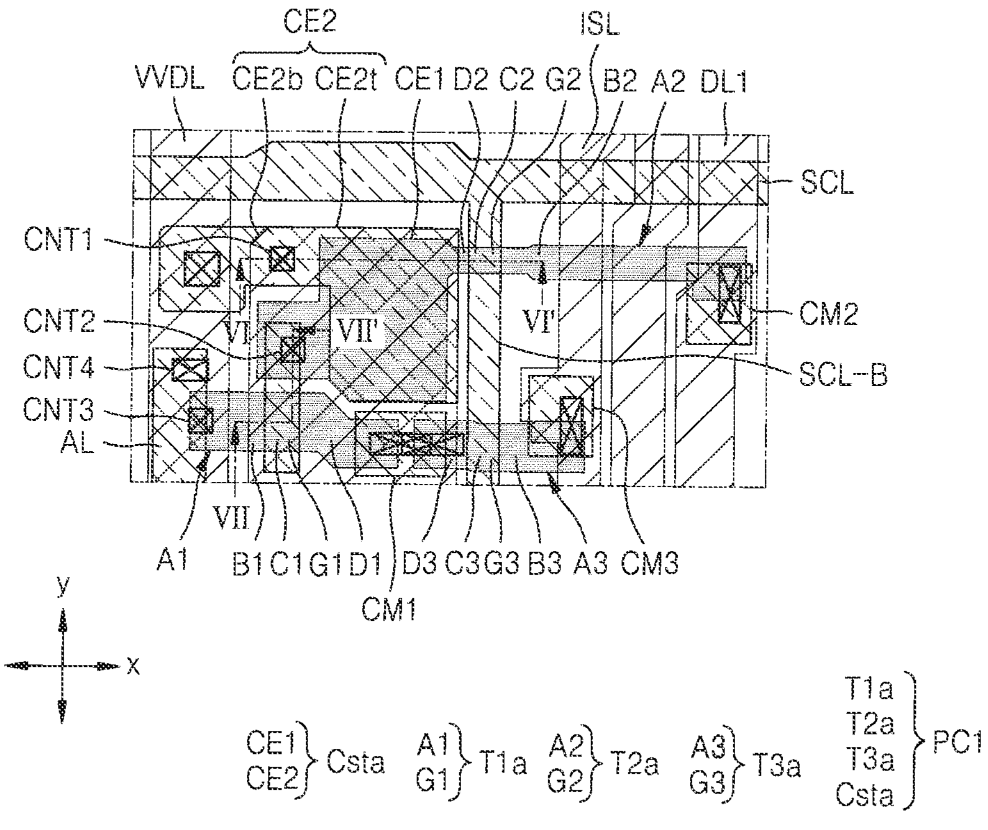
FIG. 5 is a schematic plan view of one of the sub-pixel circuits of FIG. 4.

FIG. 4 is a schematic plan view illustrating sub-pixel circuits of a display apparatus according to an embodiment and signal lines and voltage lines electrically connected to the sub-pixel circuits, and FIG. 5 is a schematic plan view of one of the sub-pixel circuits of FIG. 4.

Referring to FIG. 4, the scan line SCL may extend in a first direction (e.g., an x direction), and data lines, for example, first to third data lines DL1, DL2, and DL3, may be arranged in a second direction (e.g., a y direction) intersecting the first direction. The initialization sensing line ISL may also extend in the second direction (e.g., the y direction).

The scan line SCL may be electrically connected to vertical scan lines, for example, any one vertical scan line (e.g., a second vertical scan line VSL2) from among first and second vertical scan lines VSL1 and VSL2. For example, the scan line SCL may be electrically connected to any one vertical scan line (e.g., the second vertical scan line VSL2) through a contact hole formed in at least one insulating layer between the scan line SCL and the vertical scan lines, for example, a scan contact hole SCNT.

The first voltage line VDL may include a first horizontal voltage line HVDL extending in the first direction (e.g., the x direction), and a first vertical voltage line VVDL extending in the second direction (e.g., the y direction). The first horizontal voltage line HVDL may be electrically connected to the first vertical voltage line VVDL through a contact hole formed in at least one insulating layer between the first horizontal voltage line HVDL and the first vertical voltage line VVDL, for example, a first voltage contact hole VCNT1.

The second voltage line VSL may include a second horizontal voltage line HVSL extending in the first direction (e.g., the x direction), and a second vertical voltage line VVSL extending in the second direction (e.g., the y direction). The second horizontal voltage line HVSL may be electrically connected to the second vertical voltage line VVSL through a contact hole formed in at least one insulating layer between the second horizontal voltage line HVSL and the second vertical voltage line VVSL, for example, a second voltage contact hole VCNT2.

The sub-pixel circuits may be between the first horizontal voltage line HVDL and the second horizontal voltage line HVSL. In this regard, FIG. 4 illustrates that the first to third sub-pixel circuits PC1, PC2, and PC3 are between the first horizontal voltage line HVDL and the second horizontal voltage line HVSL. Each of the first to third sub-pixel circuits PC1, PC2, and PC3 may include first to third transistors, and a storage capacitor. For example, the first sub-pixel circuit PC1 may include first to third transistors T1*a*, T2*a*, and T3*a*, and a storage capacitor Csta. The second sub-pixel circuit PC2 may include first to third transistors T1*b*, T2*b*, and T3*b*, and a storage capacitor Cstb. The third sub-pixel circuit PC3 may include first to third transistors Tic, T2*c*, and T3*c*, and a storage capacitor Cstc. The storage capacitors Csta, Cstb, and Cstc of the first to third sub-pixel circuits PC1, PC2, and PC3 may be arranged in the second direction (e.g., the y direction).

The first to third sub-pixel circuits PC1, PC2, and PC3 may be electrically connected to the light-emitting diode ED (refer to FIG. 3) through first to third via contact holes VIA1, VIA2, and VIA3, respectively.

Referring to FIG. 5, the first transistor T1*a* of the first sub-pixel circuit PC1 may include a first semiconductor layer A1 and a first gate electrode G1 overlapping a first channel area C1 of the first semiconductor layer A1. The first semiconductor layer A1 may include the first channel area C1, a first area B1, and a second area D1, and the first area B1 and the second area D1 may be spaced apart from each other with the first channel area C1 therebetween. The first area B1 and the second area D1 of the first semiconductor layer A1 may be areas doped with impurities (e.g., n-type impurities) and areas each having a lower resistance than that of the first channel area C1, and the first area B1 and the second area D1 may respectively correspond to the first electrode and the second electrode described with reference to FIG. 3.

The first area B1 of the first semiconductor layer A1 may be electrically connected to the first vertical voltage line VVDL through a third contact hole CNT3. In an embodiment, an auxiliary line AL overlapping the first vertical voltage line VVDL and electrically connected to the first vertical voltage line VVDL through a fourth contact hole CNT4 may be electrically connected to the first area B1 of the first semiconductor layer A1 through the third contact hole CNT3.

The second area D1 of the first semiconductor layer A1 may be electrically connected to a third semiconductor layer A3 of the third transistor T3*a* and/or a second electrode CE2 (e.g., a lower electrode CE2*b*) of the storage capacitor Csta through a first connection metal CM1. The auxiliary line AL, the first connection metal CM1, and the scan line SCL may each include a same material.

The second transistor T2*a* of the first sub-pixel circuit PC1 may include a second semiconductor layer A2 and a second gate electrode G2 overlapping a second channel area C2 of the second semiconductor layer A2. A portion of the scan line SCL, for example, a portion of a branch portion SCL-B of the scan line SCL, the portion overlapping the second semiconductor layer A2, may correspond to the second gate electrode G2.

The second semiconductor layer A2 may include the second channel area C2, a first area B2, and a second area D2, and the first area B2 and the second area D2 may be spaced apart from each other with the second channel area C2 therebetween. The first area B2 and the second area D2 of the second semiconductor layer A2 may be areas doped with impurities (e.g., n-type impurities) and areas each having a lower resistance than that of the second channel area C2, and the first area B2 and the second area D2 may respectively correspond to the first electrode and the second electrode described with reference to FIG. 3.

The first area B2 of the second semiconductor layer A2 may be electrically connected to a first data line DL1 through a second connection metal CM2, and the second area D2 of the second semiconductor layer A2 may integrally electrically connected to a first electrode CE1 of the storage capacitor Csta and/or the first gate electrode G1.

The third transistor T3*a* of the first sub-pixel circuit PC1 may include the third semiconductor layer A3 and a third gate electrode G3 overlapping a third channel area C3 of the third semiconductor layer A3. A portion of the scan line SCL, for example, a portion of the branch portion SCL-B of the scan line SCL, the portion overlapping the third semiconductor layer A3, may correspond to the third gate electrode G3.

The third semiconductor layer A3 may include the third channel area C3, a first area B3, and a second area D3, and the first area B3 and the second area D3 may be spaced apart from each other with the third channel area C3 therebetween. The first area B3 and the second area D3 of the third semiconductor layer A3 may be areas doped with impurities (e.g., n-type impurities) and areas each having a lower resistance than that of the third channel area C3, and the first area B3 and the second area D3 may respectively correspond to the first electrode and the second electrode described with reference to FIG. 3.

The first area B3 of the third semiconductor layer A3 may be electrically connected to the initialization sensing line ISL through a third connection metal CM3, and the second area D3 of the third semiconductor layer A3 may be electrically connected to the first semiconductor layer A1 through the first connection metal CM1.

The first to third semiconductor layers A1, A2, and A3 may be disposed on a same layer and may include a same material. The first to third semiconductor layers A1, A2, and A3 may each include an oxide-based semiconductor material.

The first to third gate electrodes G1, G2, and G3 may be disposed on a same layer and may include a same material. The first to third gate electrodes G1, G2, and G3 may each include molybdenum (Mo), copper (Cu), titanium (Ti), a combination thereof, or the like, and may include a single-layered or multi-layered structure including the material described above. For example, the first to third electrodes G1, G2, and G3 may each have a multi-layered structure including a titanium layer and a copper layer on the titanium layer.

The storage capacitor Csta of the first sub-pixel circuit PC1 may include the first electrode CE1 and the second electrode CE2. The second electrode CE2 may include the lower electrode CE2*b* disposed below the first electrode CE1 and an upper electrode CE2*t* disposed on the first electrode CE1.

The lower electrode CE2*b* may have an isolated shape in a plan view as shown in FIG. 4. The lower electrode CE2*b* and the first data line DL1 may be disposed on a same layer, and may include a same material. For example, the lower electrode CE2*b* may include Mo, Cu, Ti, a combination thereof, or the like, and may include a single-layered or multi-layered structure including the material described above. For example, the lower electrode CE2*b* may have a multi-layered structure including a titanium layer and a copper layer on the titanium layer.

The upper electrode CE2*t* may have an isolated shape in a plan view. The upper electrode CE2*t* may be electrically connected to the lower electrode CE2*b* through a first contact hole CNT1 formed in at least one insulating layer (e.g., a first insulating layer and a third insulating layer) between the lower electrode CE2*b* and the upper electrode CE2*t*. The upper electrode CE2*t* and the scan line SCL including the branch portion SCL-B may include a same material. For example, the upper electrode CE2*t* may include Mo, Cu, Ti, a combination thereof, or the like, and may include a single-layered or multi-layered structure including the material described above. For example, the upper electrode CE2*t* may have a multi-layered structure including a titanium layer and a copper layer on the titanium layer.

The first electrode CE1 may overlap each of the lower electrode CE2*b* and the upper electrode CE2*t*. The first electrode CE1 may be integral with the second semiconductor layer A2. In other words, a partial area of the second semiconductor layer A2, the partial area being positioned on a side of the second channel area C2 of the second semiconductor layer A2, may be an area doped with an impurity (e.g., an n-type impurity), and may include the second area D2 (or the second electrode) of the second transistor T2*a* and the first electrode CE1.

The first electrode CE1 may be electrically connected to the first gate electrode G1 through a second contact hole CNT2.

The lower electrode CE2*b* may overlap a portion of the first semiconductor layer A1 as well as the upper electrode CE2*t* and the first electrode CE1. For example, as shown in FIG. 5, the lower electrode CE2*b* may be below the first channel area C1 to overlap the first channel area C1 of the first semiconductor layer A1.

A structure of the first to third transistors T1*a*, T2*a*, and T3*a* and the storage capacitor Csta of the first sub-pixel circuit PC1 described with reference to FIG. 5 may be substantially equally applied to the structures of other sub-pixel circuits. For example, each of a structure of the first to third transistors T1*b*, T2*b*, and T3*b* and the storage capacitor Cstb of the second sub-pixel circuit PC2 and a structure of the first to third transistors T1*c*, T2*c*, and T3*c* and the storage capacitor Cstc of the third sub-pixel circuit PC3, which are described with reference to FIG. 4, may be the same as the structure of the first to third transistors T1*a*, T2*a*, and T3*a* and the storage capacitor Csta of the first sub-pixel circuit PC1 described with reference to FIG. 5.

Figure 6:
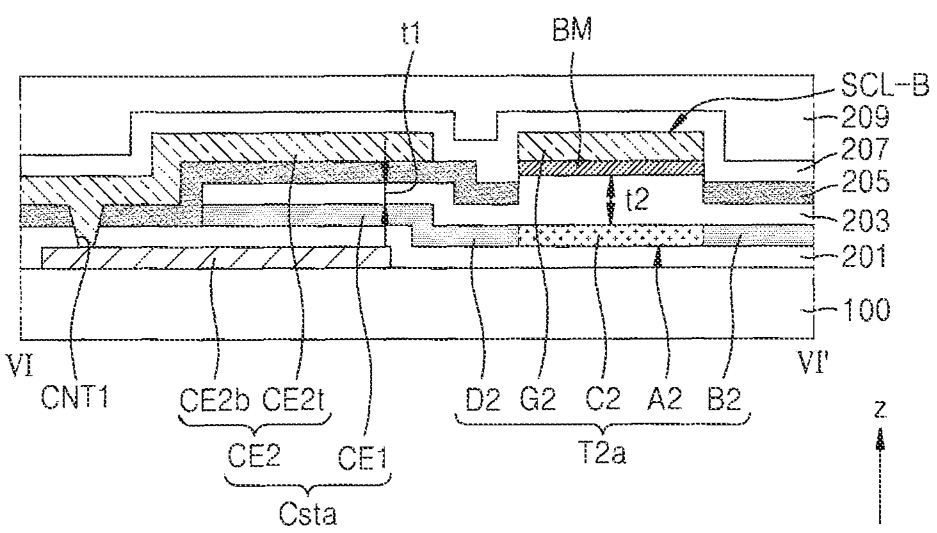
FIG. 6 is a schematic cross-sectional view illustrating a portion of the sub-pixel circuit of the display apparatus taken along line VI-VI' of FIG. 5, according to an embodiment.

FIG. 6 is a schematic cross-sectional view illustrating a portion of the sub-pixel circuit of the display apparatus taken along line VI-VI' of FIG. 5, according to an embodiment.

Referring to FIG. 6, the lower electrode CE2*b* may be disposed on the first substrate 100. The lower electrode CE2*b* may directly contact an upper surface of the first substrate 100. A first insulating layer 201 may be disposed on the lower electrode CE2*b*. The first insulating layer 201 may entirely overlap the first substrate 100.

The first substrate 100 may include a glass material or a resin material. The glass material may include transparent glass having $SiO_2$ as a main component. The resin material may include a polymer resin, such as polyethersulfone, polyarylate, polyetherimide, polyethylene naphthalate, polyethylene terephthalate, polyphenylene sulfide, polyarylate, polyimide, polycarbonate, cellulose triacetate, cellulose acetate propionate, a combination thereof, or the like. The first insulating layer 201 may include an inorganic insulating material, such as silicon oxide, silicon nitride, silicon oxynitride, or a combination thereof, and may have a singled-layered or multi-layered structure including the material described above.

The second semiconductor layer A2 may be disposed on the first insulating layer 201. The second semiconductor layer A2 may include the second channel area C2, the first area B2, and the second area D2, and the first area B2 and the second area D2 may be separated from each other with the second channel area C2 therebetween. The first area B2 and the second area D2 may each be an area doped with an impurity (e.g., an n-type impurity) as described above, and have a greater conductivity than that of the second channel area C2.

An impurity-doped area of the second semiconductor layer A2 may extend on the first insulating layer 201 to overlap the lower electrode CE2*b*, and the impurity-doped area of the second semiconductor layer A2, the impurity-doped area overlapping the lower electrode CE2*b*, may correspond to the first electrode CE1. In other words, the second area D2 of the second semiconductor layer A2 and the first electrode CE1 may be integrally connected to each other (or may be integral with each other). In other words, each of the second area D2 of the second semiconductor layer A2 and the first electrode CE1 is a portion of the impurity-doped area of the second semiconductor layer A2, and the second area D2 of the second semiconductor layer A2 and the first electrode CE1 may include the same impurities as each other.

A second insulating layer 203 may be disposed on the second semiconductor layer A2. As the second insulating layer 203 is patterned together with a semiconductor layer in case that the semiconductor layer is patterned, the second insulating layer 203 and the semiconductor layer may have a same size and shape, and the second insulating layer 203 may be on the semiconductor layer. In this regard, FIG. 6 illustrates that the second insulating layer 203 is on the second semiconductor layer A2. Although not shown in FIG. 6, second insulating layers may be also respectively disposed on the first semiconductor layer A1 and the third semiconductor layer A3 described with reference to FIG. 5. The second insulating layers, the first semiconductor layer A1, and the third semiconductor layer A3 may have a same size and shape, and the second insulating layers may be positioned on the first semiconductor layer A1 and the third semiconductor layer A3. The second insulating layer 203 may include an inorganic insulating material, such as silicon oxide, silicon nitride, silicon oxynitride, or a combination thereof, and may have a singled-layered or multi-layered structure including the material described above.

A portion of the impurity-doped area of the second semiconductor layer A2 may correspond to the first electrode CE1 of the storage capacitor Csta, and thus the second insulating layer 203 may be disposed on the first electrode CE1. An edge of the second insulating layer 203 and that of the first electrode CE1 may be positioned on substantially a same line. In other words, a side surface corresponding to an edge of the second insulating layer 203 and a side surface corresponding to an edge of the first electrode CE1 may be substantially disposed on a same virtual surface without a step-difference.

The second insulating layer 203 may include portions having different thicknesses. A thickness of a first portion of the second insulating layer 203 may be less than a thickness of a second portion of the second insulating layer 203, the first portion overlapping an impurity-doped area of a semiconductor layer, and the second portion overlapping a channel area of the semiconductor layer. In this regard, FIG. 6 illustrates that a thickness t1 of the first portion of the second insulating layer 203 is less than a thickness t2 of the second portion of the second insulating layer 203, the first portion overlapping an impurity-doped area (e.g., the first area B2 and the second area D2) of the second semiconductor layer A2, and the second portion overlapping the second channel area C2 of the second semiconductor layer A2.

A barrier metal layer BM may be positioned on the second insulating layer 203 and overlap a channel area of a semiconductor layer. In this regard, FIG. 6 illustrates that the barrier metal layer BM overlaps the second channel area C2 of the second semiconductor layer A2. The barrier metal layer BM may prevent the second channel area C2 from being doped with impurities in a process of forming the second semiconductor layer A2. The barrier metal layer BM may include a metal, such as Mo and Ti, or a compound including the metal(s) described above. For example, the barrier metal layer BM may be a material including a titanium element, such as MoTi, Ti, TiIZO, or a combination thereof.

A third insulating layer 205 may be disposed on the second insulating layer 203. The third insulating layer 205 may cover at least a side surface of a semiconductor layer. In this regard, FIG. 6 illustrates that the third insulating layer 205 covers a side surface of the second semiconductor layer A2, for example, a side surface (or edge) of the second area D2, which is an impurity-doped area. The third insulating layer 205 may not cover the barrier metal layer BM. The third insulating layer 205 may include an inorganic insulating material, such as silicon oxide, silicon nitride, silicon oxynitride, or a combination thereof, and may have a singled-layered or multi-layered structure including the material described above.

The upper electrode CE2*t* may be disposed on the third insulating layer 205. The upper electrode CE2*t* may overlap the first electrode CE1 and the lower electrode CE2*b*. A portion of the upper electrode CE2*t* may overlap the first insulating layer 201, the second insulating layer 203, the third insulating layer 205, the first electrode CE1, and the lower electrode CE2*b*. Another portion of the upper electrode CE2*t* may extend on the lower electrode CE2*b* by passing by an edge of the second insulating layer 203 and an edge of the first electrode CE1 to be electrically connected to the lower electrode CE2*b* through the first contact hole CNT1 passing through the first insulating layer 201 and the third insulating layer 205. The upper electrode CE2*t* and the lower electrode CE2*b*, which have a same voltage level, may correspond to the second electrode CE2 of the storage capacitor Csta.

In other words, the upper electrode CE2*t* may have a structure having a step-difference (or height difference) in a cross-sectional view. A vertical distance from the upper surface of the first substrate 100 to an upper surface of a portion of the upper electrode CE2*t*, the portion overlapping the second insulating layer 203, may be greater than a vertical distance from the upper surface of the first substrate 100 to an upper surface of another portion of the upper electrode CE2*t*, the another portion not overlapping the second insulating layer 203.

The upper electrode CE2*t* may be disposed above the first electrode CE1 to overlap the first electrode CE1 and the lower electrode CE2*b*. The first electrode CE1 may be a portion of the impurity-doped area of the second semiconductor layer A2 and may be integrally electrically connected to the the second area D2 of the second semiconductor layer A2, and thus the upper electrode CE2*t* disposed above the first electrode CE1 and overlapping the first electrode CE1 may mean that the upper electrode CE2*t* overlaps the impurity-doped area (e.g., the second area D2) of the second semiconductor layer A2 on the impurity-doped area (e.g., the second area D2) of the second semiconductor layer A2. Accordingly, unintentional parasitic capacitance may be prevented from being generated between the first area B2 of the second transistor T2 and a first electrode (e.g., an anode) of a light-emitting diode of a display apparatus.

In this regard, FIG. 6 illustrates that the second gate electrode G2 is disposed on the barrier metal layer BM and directly contacts the barrier metal layer BM. The second gate electrode G2 may correspond to a portion of the branch portion SCL-B of the scan line SCL as described above with reference to FIG. 5.

A fourth insulating layer 207 and a fifth insulating layer 209 may be disposed on the storage capacitor Csta and the second transistor T2*a*. The fourth insulating layer 207 may include an inorganic insulating material, such as silicon oxide, silicon nitride, silicon oxynitride, or a combination thereof, and the fifth insulating layer 209 may include an organic insulating material as a planarized insulating layer. Although not illustrated in FIG. 6, a light-emitting diode may be disposed on the fifth insulating layer 209.

Figure 7:
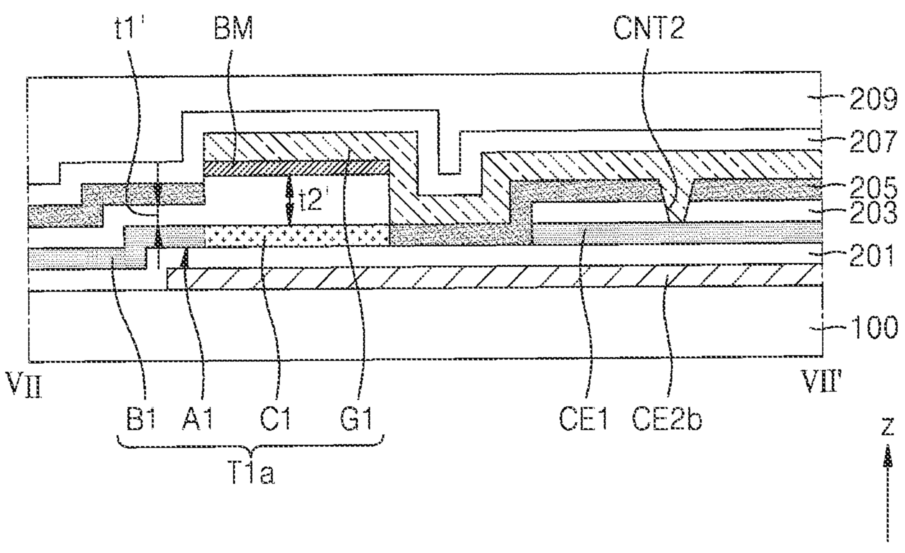
FIG. 7 is a schematic cross-sectional view illustrating a portion of the sub-pixel circuit of the display apparatus taken along line VI-VI' of FIG. 5, according to an embodiment.

FIG. 7 is a schematic cross-sectional view illustrating a portion of the sub-pixel circuit of the display apparatus taken along the line VII-VII' of FIG. 5, according to an embodiment.

Referring to FIG. 7, the lower electrode CE2*b* may be disposed on the first substrate 100, and the first insulating layer 201 may be disposed on the lower electrode CE2*b*. As described with reference to FIG. 6, the first electrode CE1 of the storage capacitor Csta may be disposed on the first insulating layer 201 and overlap the lower electrode CE2*b*.

The first semiconductor layer A1 of the first transistor T1*a* may be disposed on the first insulating layer 201. The first semiconductor layer A1 may include the first channel area C1 and impurity-doped areas respectively on both sides of the first channel area C1 as a center. In this regard, FIG. 7 illustrates the first area B1 doped with an impurity.

As described above, the second insulating layer 203 may be patterned together with a semiconductor layer in case that the semiconductor layer is patterned, and thus, the second insulating layer 203 and the semiconductor layer may have a same size and shape, and the second insulating layer 203 may be on the semiconductor layer. In this regard, FIG. 7 illustrates that the second insulating layer 203 may be disposed on the first semiconductor layer A1, and an edge of the second insulating layer 203 and that of the first semiconductor layer A1 may be disposed on a same line. In other words, a side surface corresponding to the edge of the second insulating layer 203 and a side surface corresponding to the edge of the first semiconductor layer A1 may be substantially disposed on a same virtual surface without a step-difference.

The second insulating layer 203 may include portions having different thicknesses. For example, a thickness t2' of a portion of the second insulating layer 203, the portion overlapping the first channel area C1 of the first semiconductor layer A1, may be greater than a thickness t1' of another portion of the second insulating layer 203, the another portion overlapping an impurity-doped area (e.g., the first area B1) of the first semiconductor layer A1.

The third insulating layer 205 may cover at least a side surface of a semiconductor layer. In this regard, FIG. 7 illustrates that the third insulating layer 205 covers a side surface of the first semiconductor layer A1, for example, a side surface (or edge) of the first channel area C1. The third insulating layer 205 may not cover the barrier metal layer BM, and a portion of the third insulating layer 205 may be between the first electrode CE1 and the first gate electrode G1 extending on the first electrode CE1.

The barrier metal layer BM may be arranged to overlap the first channel area C1 of the first semiconductor layer A1. The first gate electrode G1 may be disposed on the barrier metal layer BM, and a portion of the first gate electrode G1 may extend on the first electrode CE1. A portion of the first gate electrode G1, the portion overlapping the first electrode CE1, may be electrically connected to (or may directly contact) the first electrode CE1 through the second contact hole CNT2 penetrating the second insulating layer 203 and the third insulating layer 205. The fourth insulating layer 207 and the fifth insulating layer 209 may be disposed on the first transistor T1*a*.

FIGS. 8A to 8F are schematic cross-sectional views illustrating a method of manufacturing a display apparatus, according to an embodiment.

Figure 8A:
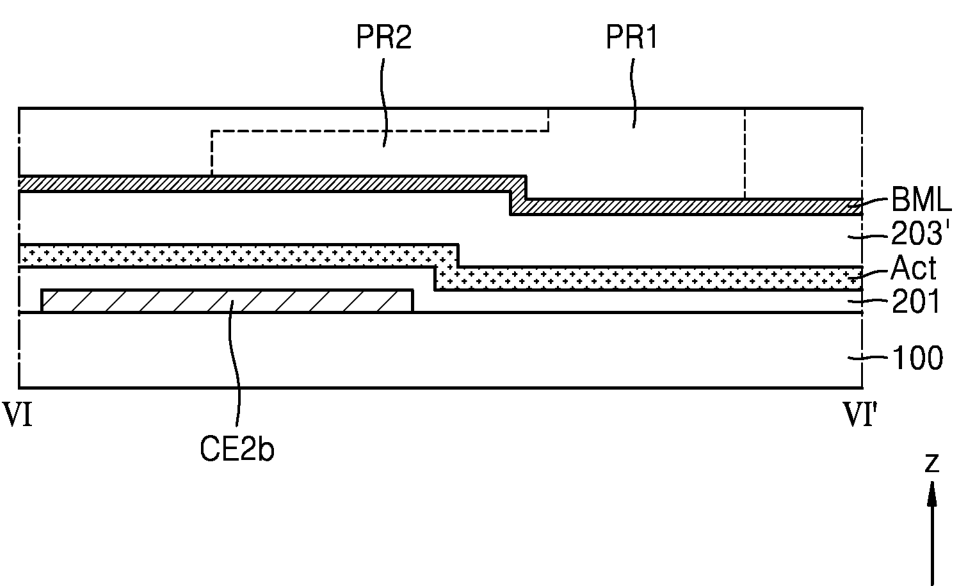
FIGS. 8A to 8F are schematic cross-sectional views illustrating a method of manufacturing a display apparatus, according to an embodiment.

Referring to FIG. 8A, the lower electrode CE2*b* may be formed on the first substrate 100, and the first insulating layer 201 may be formed. Thereafter, a semiconductor layer Act, a second preliminary insulating layer 203', and a metal layer BML may be sequentially formed on the first insulating layer 201, and a photoresist layer may be formed on the metal layer BML. A photoresist PR (refer to FIG. 8B) including a first portion PR1 and a second portion PR2, which have different thicknesses, may be formed by exposing and developing the photoresist layer by using a halftone mask.

Figure 8B:
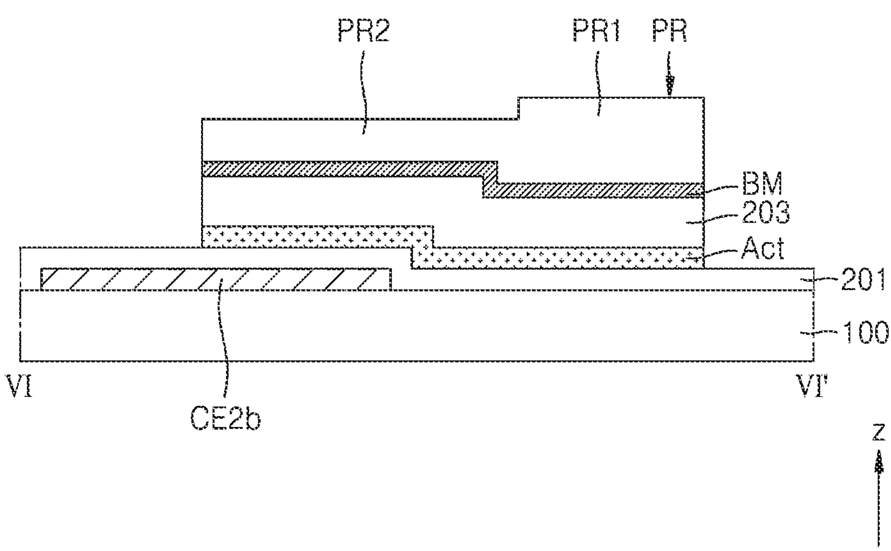

Referring to FIGS. 8A and 8B, the semiconductor layer Act, the second preliminary insulating layer 203', and the metal layer BML may be patterned by using the photoresist PR. A portion of each of the semiconductor layer Act, the second preliminary insulating layer 203', and the metal layer BML, the portion not overlapping the photoresist PR, may be removed, and thus, as shown in FIG. 8B, the semiconductor layer Act, the second insulating layer 203, and the barrier metal layer BM, which are patterned, may be formed below the photoresist PR, and the semiconductor layer Act, the second insulating layer 203, and the barrier metal layer BM may overlap each other and have a same shape and size.

Figure 8C:
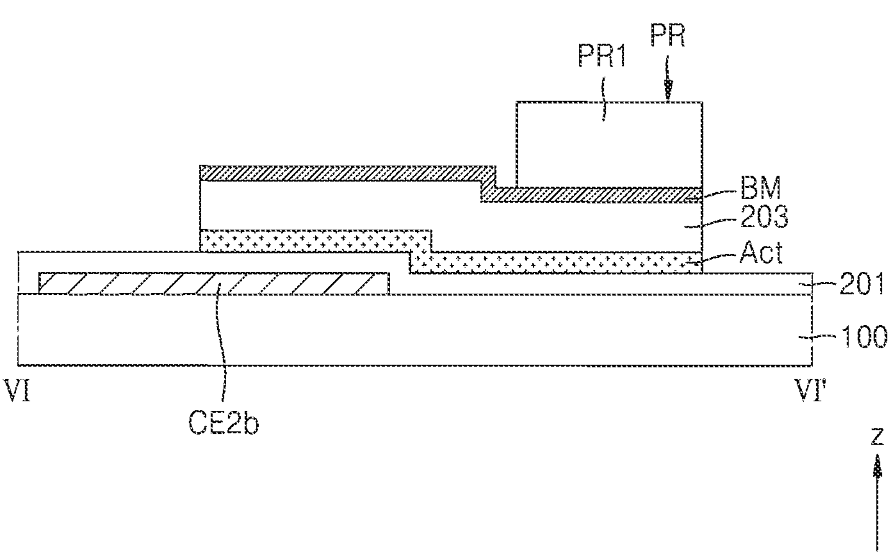
Figure 8D:
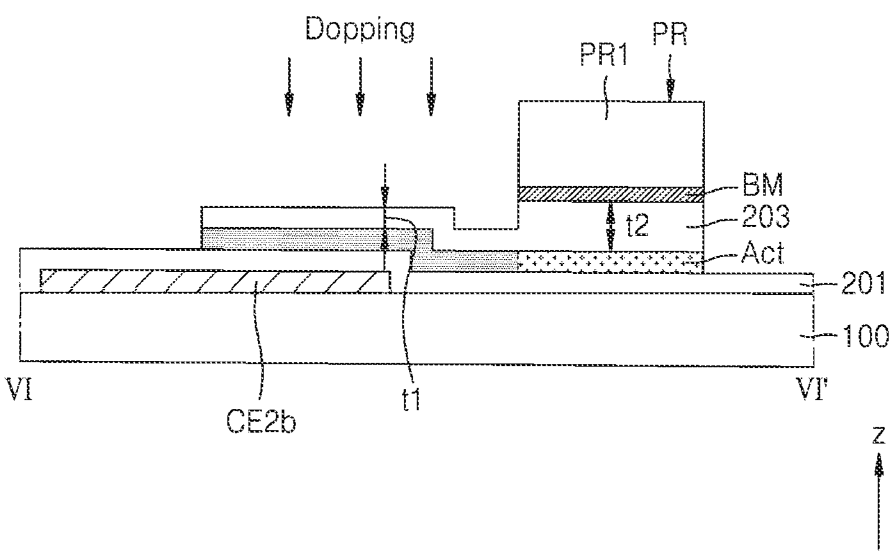

In case that the photoresist PR is etchbacked, as shown in FIG. 8C, only the first portion PR1 of the photoresist PR may remain, and a portion of the barrier metal layer BM may be removed by using the first portion. Thus, the barrier metal layer BM may remain on only a portion of the second insulating layer 203. In a process of removing a portion of the barrier metal layer BM, a portion of the second insulating layer 203 below the portion of the barrier metal layer BM, which is removed, may be removed. Accordingly, the second insulating layer 203 may include portions having different thicknesses, as shown in FIG. 8D. For example, the second insulating layer 203 may include a first portion overlapping the second channel area C2 and the barrier metal layer BM, and a second portion overlapping the first and second areas B2 and D2, which are impurity-doped areas. The thickness t1 of the first portion of the second insulating layer 203 may be less than the thickness t2 of the second portion of the second insulating layer 203.

Figure 8E:
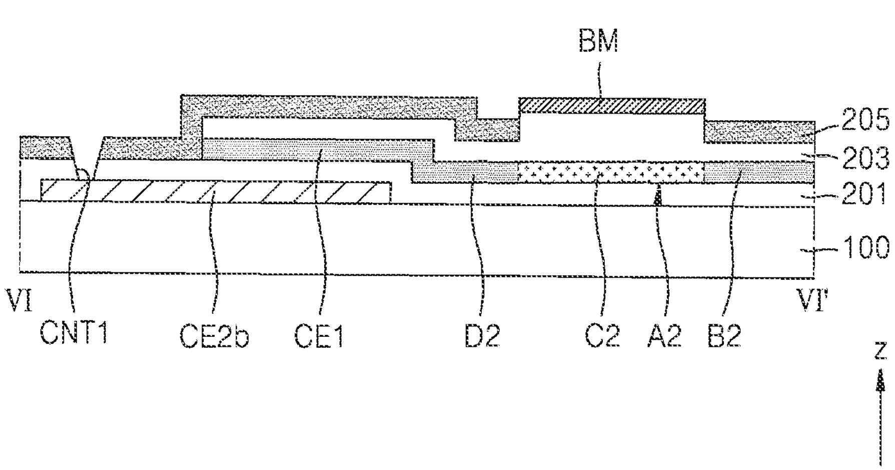
Figure 8F:
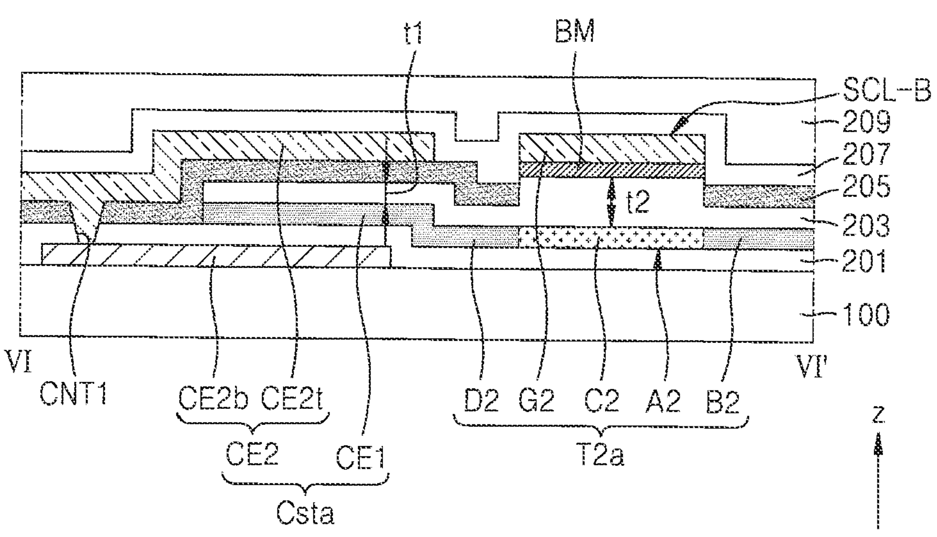

As shown in FIG. 8D, the semiconductor layer Act may be doped with an impurity by using a portion of the barrier metal layer BM as a self-alignment mask. In some embodiments, the impurity may be an n-type impurity or a p-type impurity. In this regard, FIG. 8E illustrates that the second semiconductor layer A2 including the first area B1, the second area D2, and the second channel area C2 is formed through a doping process, wherein the first area B1 and the second area D2 are formed through a doping process, and the second channel area C2 is between the first area B1 and the second area D2. A portion of the impurity-doped area (e.g., the second area D2) of the second semiconductor layer A2 may correspond to the first electrode CE1.

After the doping process, as shown in FIG. 8E, the third insulating layer 205 may be formed. The third insulating layer 205 may not overlap the second channel area C2 and the barrier metal layer BM, and may cover a side surface (or edge) of the second semiconductor layer A2 and a side surface (or edge) of the first electrode CE1, which are not covered by the second insulating layer 203. The third insulating layer 205 may directly contact the side surface (or edge) of the second semiconductor layer A2 and the side surface (or edge) of the first electrode CE1. A portion of the third insulating layer 205 may extend by passing by the side surface (or edge) of the second semiconductor layer A2 and the side surface (or edge) of the first electrode CE1, and may contact an upper surface of the first insulating layer 201.

After the third insulating layer 205 is formed, the first contact hole CNT1 penetrating the third insulating layer 205 and the first insulating layer 201 and exposing a portion of the lower electrode CE2*b* may be formed.

Thereafter, the upper electrode CE2*t* and the second gate electrode G2 (or the branch portion SCL-B of the scan line SCL in FIG. 4) may be formed. The upper electrode CE2*t* may overlap the first electrode CE1 and the lower electrode CE2*b*. A portion of the upper electrode CE2*t* may extend by passing by the side surface (or edge) of the second semiconductor layer A2 and the side surface (or edge) of the first electrode CE1, and may be electrically connected to the lower electrode CE2*b* through the first contact hole CNT1. After the upper electrode CE2*t* and the second gate electrode G2 are formed, the fourth insulating layer 207 and the fifth insulating layer 209 may be formed.

According to an embodiment, the capacitance of a capacitor may be increased, an operation of manufacturing a display apparatus may be simplified, and a display apparatus having desired quality, such as reducing parasitic capacitance, may be provided. Such effects are examples, and the scope of the disclosure is not limited thereto.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:

a first transistor comprising:
- a first semiconductor layer on a substrate; and
- a first gate electrode overlapping a first channel area of the first semiconductor layer in a plan view;

a second transistor comprising:
- a second semiconductor layer on the substrate; and
- a second gate electrode overlapping a second channel area of the second semiconductor layer in a plan view; and a storage capacitor electrically connected to the first transistor and the second transistor and comprising a first electrode and a second electrode, the first electrode and the second electrode overlapping each other in a plan view; wherein;
- the second electrode of the storage capacitor comprises a lower electrode below the first electrode and an upper electrode above the first electrode, the lower electrode and the upper electrode being electrically connected to each other,
- the second semiconductor layer comprises a first area and a second area spaced apart from each other with the second channel area between the first and second areas, and
- the first electrode of the storage capacitor is disposed in the second area of the second semiconductor layer,
- wherein the first gate electrode of the first transistor has an isolated shape in a plan view and is electrically connected to the first electrode.

2. A display apparatus comprising:

a first transistor comprising:
- a first semiconductor layer on a substrate; and
- a first gate electrode overlapping a first channel area of the first semiconductor layer in a plan view;

a second transistor comprising:
- a second semiconductor layer on the substrate; and
- a second gate electrode overlapping a second channel area of the second semiconductor layer in a plan view; and a storage capacitor electrically connected to the first transistor and the second transistor and comprising a first electrode and a second electrode, the first electrode and the second electrode overlapping each other in a plan view; wherein:
- the second electrode of the storage capacitor comprises a lower electrode below the first electrode and an upper electrode above the first electrode, the lower electrode and the upper electrode being electrically connected to each other,
- the second semiconductor layer comprises a first area and a second area spaced apart from each other with the second channel area between the first and second areas,
- the first electrode of the storage capacitor is disposed in the second area of the second semiconductor layer; and
- the display apparatus further comprises:
  - a first insulating layer between the lower electrode and the first electrode; and
  - a second insulating layer on the second semiconductor layer and the first electrode;
  - wherein a side surface of the second semiconductor layer and a side surface of the first electrode directly contact a third insulating layer rather than the second insulating layer.

3. The display apparatus of claim 2, wherein the second insulating layer comprises:
- a first portion overlapping the first area and the second area of the second semiconductor layer in a plan view and having a first thickness; and
- a second portion overlapping the second channel area of the second semiconductor layer in a plan view and having a second thickness that is greater than the first thickness.

4. The display apparatus of claim 2, wherein:
- a first portion of the upper electrode overlaps the first electrode and the second insulating layer in a plan view, and
- a second portion of the upper electrode extends on the lower electrode by passing by the side surface of the first electrode and a side surface of the second insulating layer.

5. The display apparatus of claim 4, wherein the second portion of the upper electrode is electrically connected to the lower electrode through a first contact hole penetrating a portion of the first insulating layer and a portion of the third insulating layer, the first insulating layer and the third insulating layer being between the upper electrode and the lower electrode.

6. The display apparatus of claim 1, further comprising:
- an insulating layer having a portion between the first channel area of the first semiconductor layer and the first gate electrode,
- wherein a thickness of the portion of the insulating layer is greater than a thickness of another portion of the insulating layer, the another portion being positioned on an impurity-doped area of the first semiconductor layer.

7. The display apparatus of claim 6, wherein:
- a first portion of the first gate electrode overlaps the first channel area of the first semiconductor layer in a plan view, and
- a second portion of the first gate electrode extends on the first electrode and is electrically connected to the first electrode through a second contact hole penetrating at least one insulating layer between the first electrode and the second portion.

8. The display apparatus of claim 1, wherein a portion of the lower electrode overlaps the first channel area of the first semiconductor layer and the first gate electrode in a plan view.

9. The display apparatus of claim 1, further comprising:
- barrier metal layers respectively between the first channel area of the first semiconductor layer and the first gate electrode and between the second channel area of the second semiconductor layer and the second gate electrode.

10. The display apparatus of claim 9, wherein each of the barrier metal layers comprises titanium.

11. A display apparatus comprising:

a first transistor comprising:

a first semiconductor layer disposed on a substrate; and a first gate electrode overlapping a first channel area of the first semiconductor layer in a plan view;

a second transistor comprising:

a second semiconductor layer disposed on the substrate; and a second gate electrode overlapping a second channel area of the second semiconductor layer in a plan view;

a storage capacitor electrically connected to the first transistor and the second transistor, wherein the second semiconductor layer comprises a first area and a second area which are spaced apart from each other with the second channel area between the first and second areas, the storage capacitor comprises:

a first electrode electrically connected to the first gate electrode and the second semiconductor layer;

a lower electrode between the substrate and the first electrode;

a first insulating layer between the lower electrode and the first electrode;

an upper electrode disposed on the first electrode and electrically connected to the lower electrode;

a second insulating layer between the first electrode and the upper electrode; and a third insulating layer covering a side surface of the first electrode and a side surface of the second semiconductor layer and having a portion between the lower electrode and the upper electrode, the first electrode of the storage capacitor is integral with the second semiconductor layer, and a thickness of a first portion of the second insulating layer is greater than a thickness of a second portion of the second insulating layer, the first portion overlapping the first electrode in a plan view, and the second portion overlapping the second channel area of the second semiconductor layer in a plan view.

12. The display apparatus of claim 11, wherein the third insulating layer directly contacts the side surface of the second semiconductor layer and the side surface of the first electrode.

13. The display apparatus of claim 11, wherein:

a first portion of the upper electrode overlaps the first electrode and the second insulating layer in a plan view, and a second portion of the upper electrode extends on the lower electrode by passing by the side surface of the first electrode and a side surface of the second insulating layer.

14. The display apparatus of claim 13, wherein the second portion of the upper electrode is electrically connected to the lower electrode through a first contact hole penetrating a portion of the first insulating layer and a portion of the third insulating layer, the first insulating layer and the third insulating layer being between the upper electrode and the lower electrode.

15. The display apparatus of claim 11, further comprising:

barrier metal layers respectively between the first channel area of the first semiconductor layer and the first gate electrode and between the second channel area of the second semiconductor layer and the second gate electrode.

16. The display apparatus of claim 15, wherein each of the barrier metal layers comprises titanium.

17. The display apparatus of claim 11, wherein the first gate electrode of the first transistor has an isolated shape in a plan view and is electrically connected to the first electrode.

18. The display apparatus of claim 11, wherein:

a first portion of the first gate electrode overlaps the first channel area in a plan view, and a second portion of the first gate electrode is disposed on the third insulating layer covering a side surface of the first channel area and a side surface of the first electrode and is electrically connected to the first electrode through a second contact hole penetrating the third insulating layer and the second insulating layer.

19. The display apparatus of claim 11, wherein a portion of the lower electrode overlaps the first channel area of the first semiconductor layer and the first gate electrode in a plan view.

* * * * *